United States Patent [19]

Fawal

[11] Patent Number: 5,136,182
[45] Date of Patent: Aug. 4, 1992

[54] CONTROLLED VOLTAGE OR CURRENT SOURCE, AND LOGIC GATE WITH SAME

[75] Inventor: Marwan A. Fawal, Santa Clara, Calif.

[73] Assignee: Advanced Micro Devices, Inc., Sunnyvale, Calif.

[21] Appl. No.: 576,020

[22] Filed: Aug. 31, 1990

[51] Int. Cl.[5] .................. H03K 19/003; H03K 3/01
[52] U.S. Cl. .................. 307/296.8; 307/443; 307/450; 307/491; 307/310
[58] Field of Search .......... 307/296.6, 296.8, 443, 307/450, 491, 580, 310

[56] References Cited

U.S. PATENT DOCUMENTS

| 4,768,170 | 8/1988 | Hoff | 307/310 X |
| 4,853,654 | 8/1989 | Sakurai | 331/176 X |
| 5,017,807 | 5/1991 | Kriz et al. | 307/310 X |

Primary Examiner—David Mis
Attorney, Agent, or Firm—Fliesler, Dubb, Meyer & Lovejoy

[57] ABSTRACT

A controlled voltage or current source comprises a first CMOS active voltage divider, which generates a first reference voltage at a first reference node as a first function of temperature, and a second CMOS active voltage divider, which generates a second reference voltage at a second reference node as a second function of temperature. A CMOS difference amplifier, generates the controlled voltage as a function of the difference between the first reference voltage and the second voltage reference, and of a third function of temperature. A final amplifier stage offsets changes in the source voltage. In another aspect, temperature compensated NAND and NOR gates are provided using the controlled voltage source.

50 Claims, 10 Drawing Sheets

CONTROLLED VOLTAGE OR CURRENT SOURCE, AND LOGIC GATE WITH SAME

BACKGROUND OF THE INVENTION

1. Field of the Invention

The present invention relates to voltage or current sources which generate a reference voltage or current as a predetermined function of temperature, and which can offset changes in a supply voltage.

2. Description of Related Art

Controlled voltage and current sources have a wide variety of applications in integrated circuit technology, and in other technologies. A variety of circuit design techniques have been developed for the purpose of generating a reference voltage which is stable with changes in temperature, or a reference voltage which does not change with fluctuations in the supply voltage. These circuits are relatively complex which require significant area on integrated circuits which implement them.

It is desirable to design a reference voltage or current source which uses a small number of transistors and can be adapted to provide a constant reference independent of temperature, or a reference which rises or falls with temperature in a predetermined relationship. Also, it is desirable to have such a reference source which is capable of offsetting any changes in the source voltage driving the circuit.

SUMMARY OF THE INVENTION

The present invention provides an apparatus which is coupled between first and second voltage sources for generating a controlled voltage or current. The apparatus comprises a first circuit, such as an active voltage divider, which generates a first reference voltage at a first reference node as a first function of temperature. A second circuit, such as an active voltage divider, is also included, and generates a second reference voltage at a second reference node as a second function of temperature.

An output stage including a difference amplifier, generates the controlled voltage or current as a function of the difference between the first reference voltage and the second reference voltage, and of a third function of temperature.

The output stage for the controlled voltage embodiment includes in one aspect of the invention, a circuit which offsets changes in the source voltage, such as a specially designed inverting amplifier.

Furthermore, in another aspect of the invention, a means is provided for enabling or disabling current flow from the supply voltage sources to the apparatus for generating the controlled voltage.

In the preferred embodiment, the apparatus is implemented using CMOS technology on a single, integrated circuit. The first active voltage divider is implemented using a p-channel and an n-channel MOS transistor connected as a voltage divider with characteristic parameters, including channel widths and channel lengths, selected to determine the first function of temperature. Likewise, the second voltage divider is implemented using the same techniques to define a second function of temperature. These functions can be designed so that the difference between the reference voltages changes in a predetermined manner with temperature.

Likewise, the output stage is implemented using a CMOS difference amplifier in which the characteristic parameters of the transistors used are selected to provide a predetermined gain and the third function of temperature.

In another aspect of the invention, temperature compensated NAND and NOR gates are provided using the controlled voltage source according to the present invention.

Other aspects and advantages of the present invention can be seen upon review of the figures, the detailed description, and the claims which follow.

DETAILED DESCRIPTION

Figure 1:
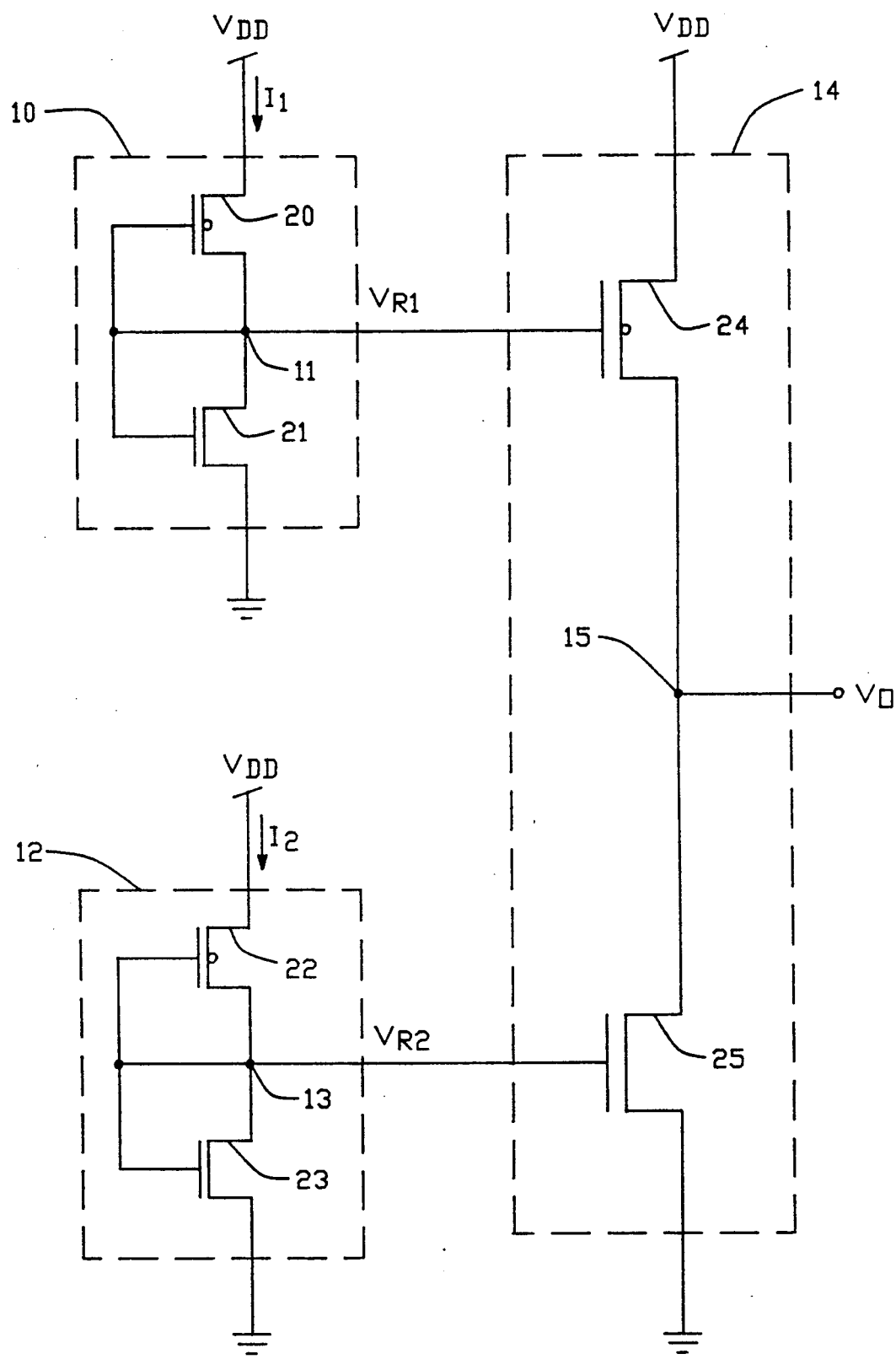
FIG. 1 is a schematic diagram of a preferred embodiment of the invention for generating a temperature compensated signal.
Figure 2:
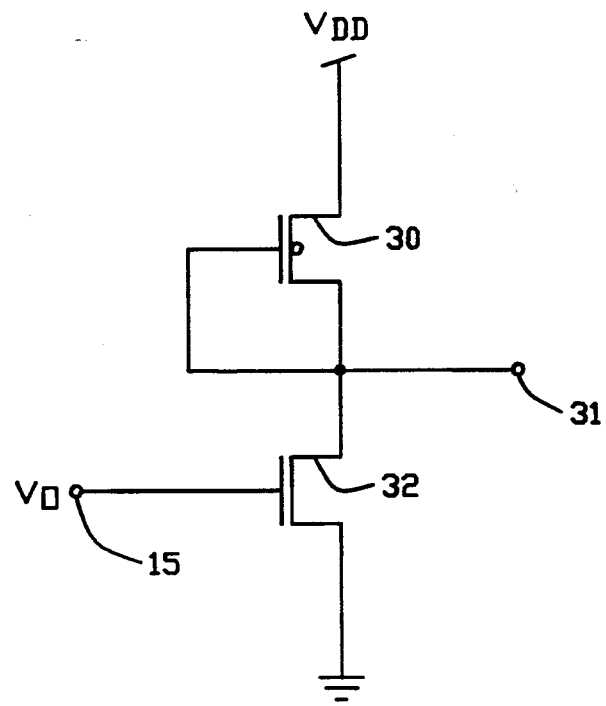
FIG. 2 is a schematic diagram of an output stage for offsetting changes in the output of the circuit of FIG. 1 due to changes in the supply voltage.

A detailed description of the preferred embodiments of the present invention is provided with reference to the Figures. With reference to FIGS. 1 and 2, the basic controlled voltage source is described. With reference to FIGS. 3, 4, 5, and 6, applications of the invention are set out.

FIGS. 7-12 are utilized in setting out a design example for implementation of the present invention.

I. The Basic Design of the Controlled Voltage Source

FIGS. 1 and 2 illustrate the design of the basic controlled voltage source according to the present invention. As can be seen in FIG. 1, the circuit includes a first active voltage divider 10 which generates a voltage $V_{R1}$ at a first reference node 11 as a first function of temperature. Also, a second active voltage divider 12 is included which generates a reference voltage $V_{R2}$ at a second reference node 13 as a second function of temperature.

The first reference voltage $V_{R1}$ and the second reference voltage $V_{R2}$ are supplied as inputs to a difference amplifier 14. Difference amplifier 14 generates an output voltage $V_0$ at an output node 15 as a function of the difference between $V_{R1}$ and $V_{R2}$, and as a third function of temperature.

The output $V_0$ is a signal which is generated as a selected function of temperature, and is therefore temperature compensated, as that term is used herein. For circuits which require that the reference voltage also be constant with changes in the supply voltage, an output stage, as shown on FIG. 2, is required. However, as many applications do not require compensation for changes in the supply voltage, the basic circuit has been illustrated in FIG. 1 without the second output stage.

The active voltage divider 10 consists of the first p-channel MOS transistor 20 having a source coupled to the supply voltage $V_{DD}$, a gate connected to the first reference node 11, and a drain connected to the first reference node 11. Also, the active voltage divider 10 includes an n-channel MOS transistor 21 having a source coupled to ground, and a gate and drain connected to the reference node 11.

Similarly, the active voltage divider 12 includes a p-channel MOS transistor 22 with a source coupled to the supply voltage $V_{DD}$, and a gate and drain connected to the reference node 13. Finally, the active voltage divider 12 includes an n-channel MOS transistor 23 with a source coupled to ground, and a gate and a drain connected to the reference node 13.

The difference amplifier 14 consists of a p-channel MOS transistor 24 with a source coupled to the supply voltage $V_{DD}$, a gate connected to the first reference node 11, and a drain connected to the output node 15. Also, an n-channel MOS transistor 25 is included in the difference amplifier 14. The source of the n-channel MOS transistor 25 is coupled to ground, the gate is connected to the second reference node 13, and the drain is connected to the output node 15.

By manipulating the channel widths and channel lengths of the transistors in each of the active voltage dividers, the first and second functions of temperature are defined. This results in reference voltages $V_{R1}$ and $V_{R2}$ which vary in a manner such that the difference between the reference voltages reflected in the output voltage $V_0$ at node 15 varies in a predetermined manner with temperature.

The transistors in the difference amplifier 14 are likewise designed to achieve a gain and a temperature characteristic to optimize the desired characteristic of the output voltage.

In addition to manipulating the channel widths and lengths of the transistors, other techniques can be used such as controlling the doping concentrations or other factors which determine the mobilities of the carriers in the transistors, or designing the transistors to reflect short channel effects and the like. However, because the present invention is designed to be implemented in an integrated circuit, it is often more expedient to simply manipulate the channel widths and lengths to achieve the desired results.

In FIG. 2, an output stage which will offset changes in the supply voltage $V_{DD}$ which are reflected in the output voltage $V_0$ is provided. The circuit in FIG. 2 consists of a CMOS inverter with a p-channel transistor 30 having a source coupled to $V_{DD}$, and a gate and a drain connected to an output node 31. Also, an n-channel transistor 32, has its drain connected to the output node 31, its gate connected to node 15 of FIG. 1 receiving the voltage $V_0$, and its source coupled to ground. The characteristic parameters of the p-channel transistor 30 and the n-channel transistor 30, 32 are selected to provide a gain for the inverter stage shown in FIG. 2, such that any change in $V_0$ due to changes in the supply voltage $V_{DD}$, are offset. In operation, as $V_0$ rises with $V_{DD}$, the transistor 32 will conduct a greater amount of current, tending to pull the voltage at node 31 downward, while the increase in the supply voltage $V_{DD}$ tends to pull the voltage at node 31 upward. In this way, the node 31 will remain essentially constant as the supply voltage goes up. Similarly, when the supply voltage goes down, the opposite effect occurs, keeping the node 31 independent of fluctuations in $V_{DD}$.

FIGS. 1 and 2 set out a circuit by which an output voltage is generated which is temperature compensated and compensates for changes in the supply voltage. The number of transistors used to implement this circuit is quite small compared to prior art systems, and can be designed to provide excellent performance.

Thus, the present invention presents a controlled voltage or current source, with a single topology, that can meet the specifications of many applications. For example, the output can be designed to give us an increasing or decreasing voltage with increasing temperature. In addition, the output voltage can track the supply voltage or have a predetermined gain with the change in $V_{DD}$. The heart of this circuit is two Active Voltage Dividers (AVD), that control the output CMOS amplifier stage.

Each AVD drives its corresponding output MOSFET as in a current mirror. One may look at FIG. 1 as two inverted current mirrors where the output stage of one is acting as the load for the other or vice-versa depending on each AVD I-V characteristics.

II. Designing the Controlled Source

A. I-V Characteristics of AVD

A high degree of design flexibility is attained by full utilization and manipulation controlling parameters of each AVD, namely channel length, width, and type of each MOSFET.

By using I-V relationship of the simple model of a MOSFET, Eq. 1, we can derive $V_{R1}$ or $V_{R2}$ ($V_R$) in terms of transistor parameters, Eq. 2.

Equation 1

$$In = ((k'n * Wn)/(2*Ln)) * ((V_R - VTn)**2)$$

$$Ip = ((k'p * Wp)/(2*Lp)) * ((V_{DD} - V_R) - |VTp|)**2)$$

Equation 2

$$V_R = \frac{VT_n + (V_{DD} + VT_p) \cdot ((k'p\ W_p\ L_n / k'n\ W_n\ L_p)^{} 1/2)}{1 + ((k'p\ W_p\ L_n / k'n\ W_n\ L_p)^{} 1/2)}$$

k'n = intrinsic transconductance of the n-channel device
Wn = channel width of the n-channel device
Ln = channel length of the n-channel device
VTn = threshold voltage of the n-channel device
k'p = intrinsic transconductance of the p-channel device
Wp = channel width of the p-channel device
Lp = channel length of the p-channel device
VTp = threshold voltage of the p-channel device The mobility of holes is lower than the mobility of electrons. The temperature effect is more pronounced on p-type semiconductor, consequently a p-channel device's I-V characteristics are affected by temperature variations more than an n-channel type device. k'p and k'n values have been extrapolated through simulations. Data are presented in Table I, which will be useful for manual calculations as will be shown in a design example.

TABLE I

| | | TEMPERATURE EFFECT ON MOBILITY | | | |
| | | WIDE & LONG | | WIDE & SHORT | |
| | | N-CHANNEL | P-CHANNEL | N-CHANNEL | P-CHANNEL |
|---|---|---|---|---|---|
| k' | @ 0° C. | 64.4 | 19.9 | 69.3 | 37.4 |
| uA | 25° C. | 55.5 | 17.9 | 63.3 | 33.7 |
| V² | 100° C. | 37.6 | 13.7 | 49.7 | 25.6 |
| VT | @ 0° C. | 0.75 | −0.93 | 0.47 | −0.78 |
| (V) | 25° C. | 0.74 | −0.91 | 0.46 | −0.76 |
| | 100° C. | 0.70 | −0.85 | 0.44 | −0.69 |

Figure 7:
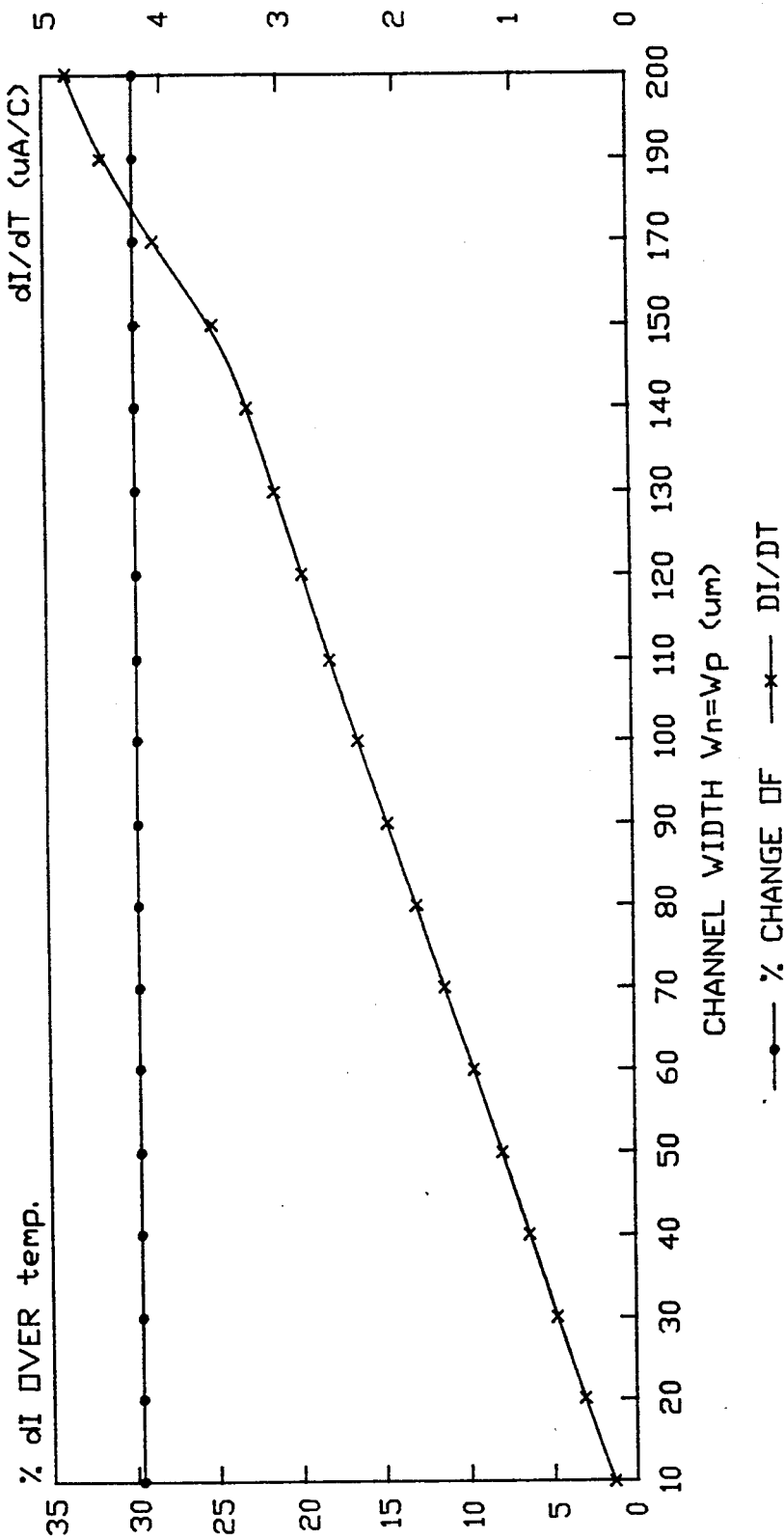
FIG. 7 is a graph of the percentage change in current, over a temperature range of 0°-100°, and of the rate of change of current with respect to temperature, versus the channel width, where the channel widths of the n- and p-channel devices are equal and the channel lengths are constant.

The characteristics of the AVDs have been plotted under different conditions in FIGS. 7-12. In FIG. 7, both channel lengths are kept fixed and equal to each other, and Wp = Wn = 10 to 200 um. The change in current per degree Celsius (dI/dT) is linear with channel's width as expected (due to the negligible change in temperature effect on both devices with fixed channel length) and linear increase of channel width.

$$\frac{dI}{dT} = \frac{I\ 0°\ C. - I\ 100°\ C.}{100°\ C.}$$

Figure 8:
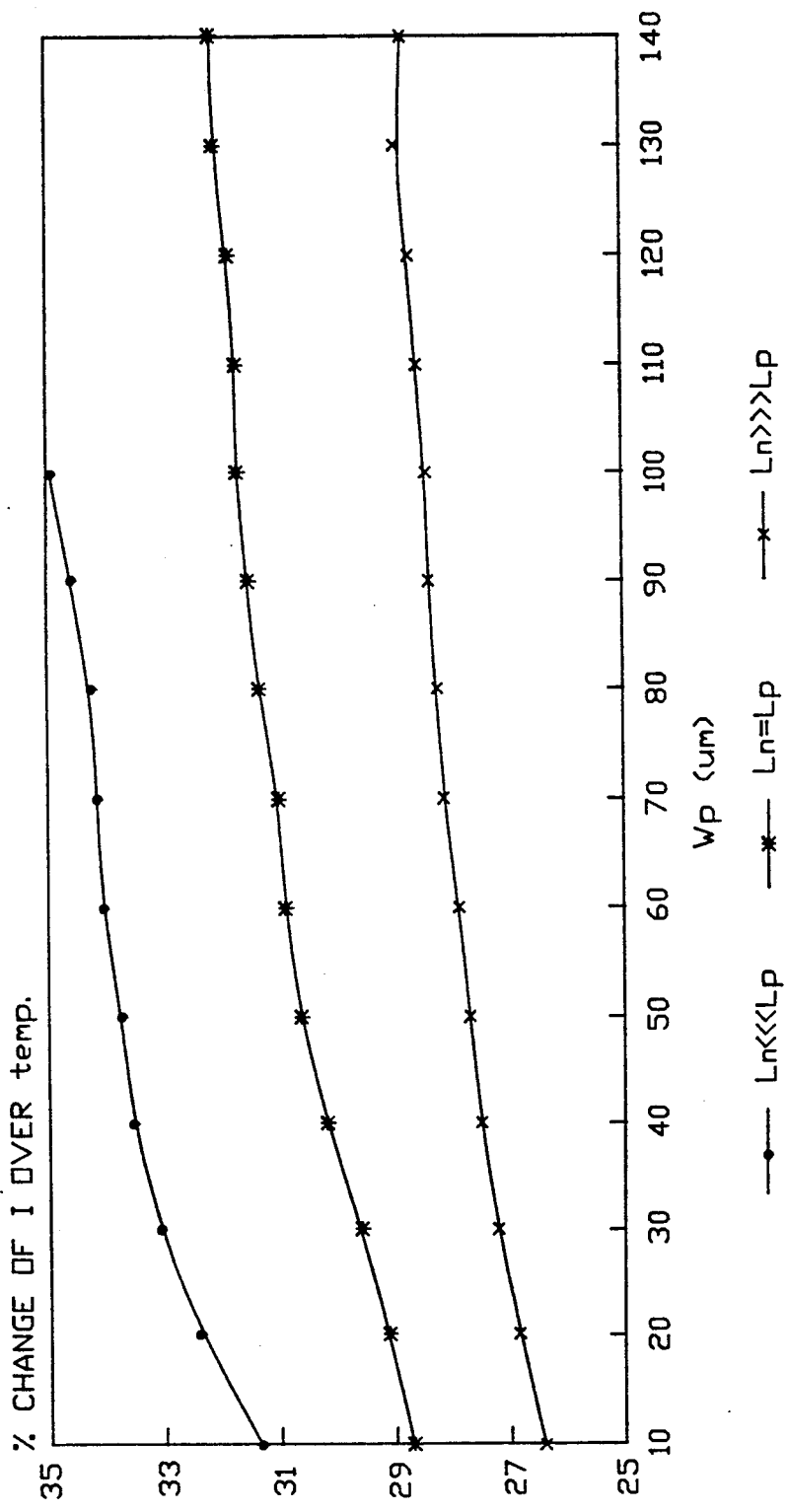
FIG. 8 is a graph of the percentage change of current over the temperature range where the n-channel width is fixed and the width of the p-channel device is varied for three conditions, including a first condition in which the length of the n-channel is much less than the length of the p-channel, a second condition in which the length of the n-channel is equal to the length of the p-channel, and a third condition in which the length of the n-channel is much greater than the length of the p-channel.
Figure 9:
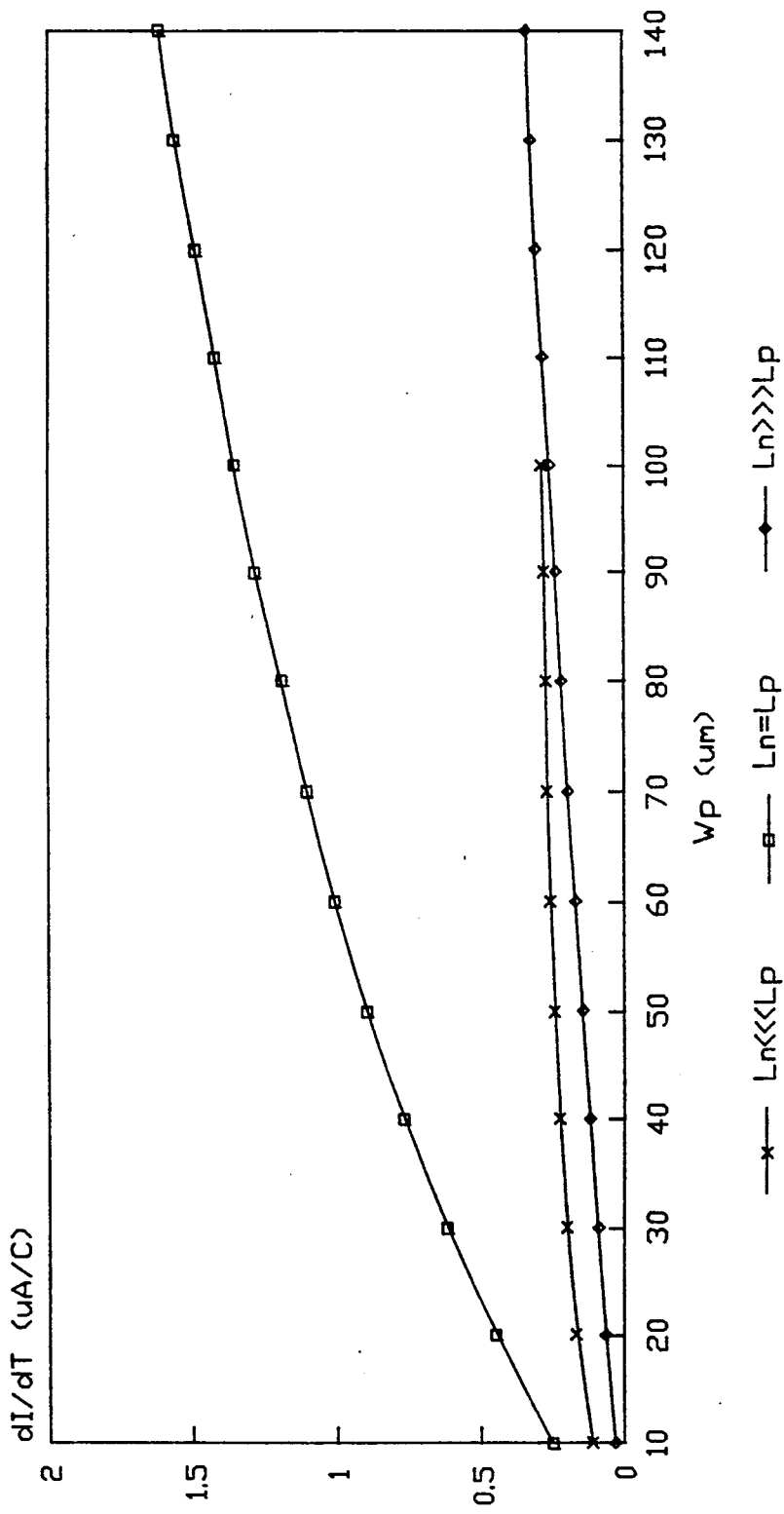
FIG. 9 is a graph of the rate of change of current over temperature with a fixed n-channel width, versus the width of the p-channel in the three conditions mentioned with respect to FIG. 8.

The percentage change in current (% dI) over temperature is calculated as follows:

$$\%\ dI = 100 \cdot \frac{I\ 0°\ C. - I\ 100°\ C.}{I\ 0°\ C.}$$

and because both width and length are equal for both devices, the % dI and % change in $V_R$ remain constant over temperature. FIGS. 8 and 9 represent %dI and dI/dT vs. Wp while holding Wn fixed for the three channel length L conditions, Lp<<<Ln, Lp=Ln and Lp>>>Ln.

Figure 10:
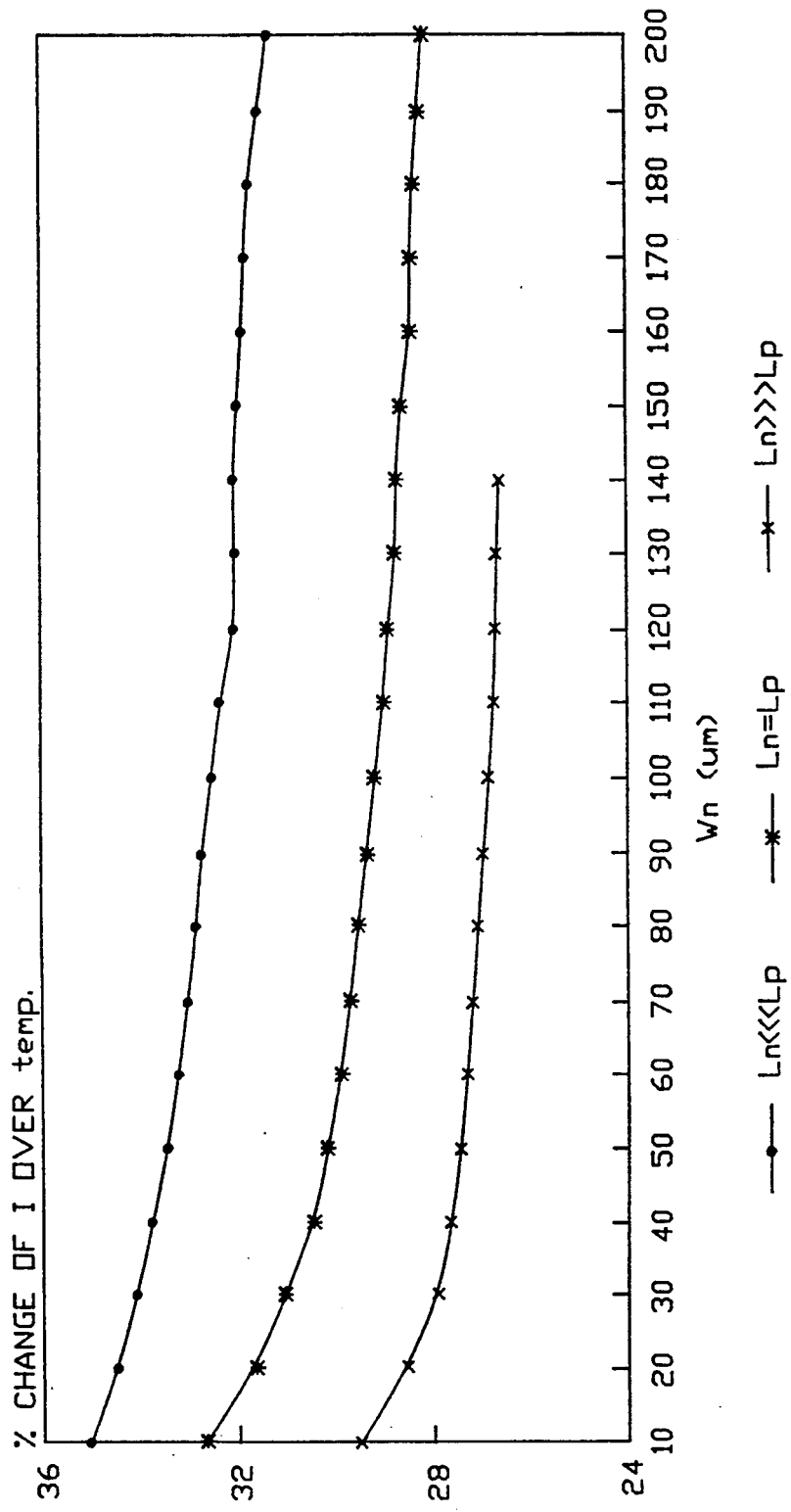
FIG. 10 is a graph showing the percentage change of current over temperature where the p-channel width is fixed, and the n-channel width is varied in the three conditions mentioned with respect to FIG. 8.
Figure 11:
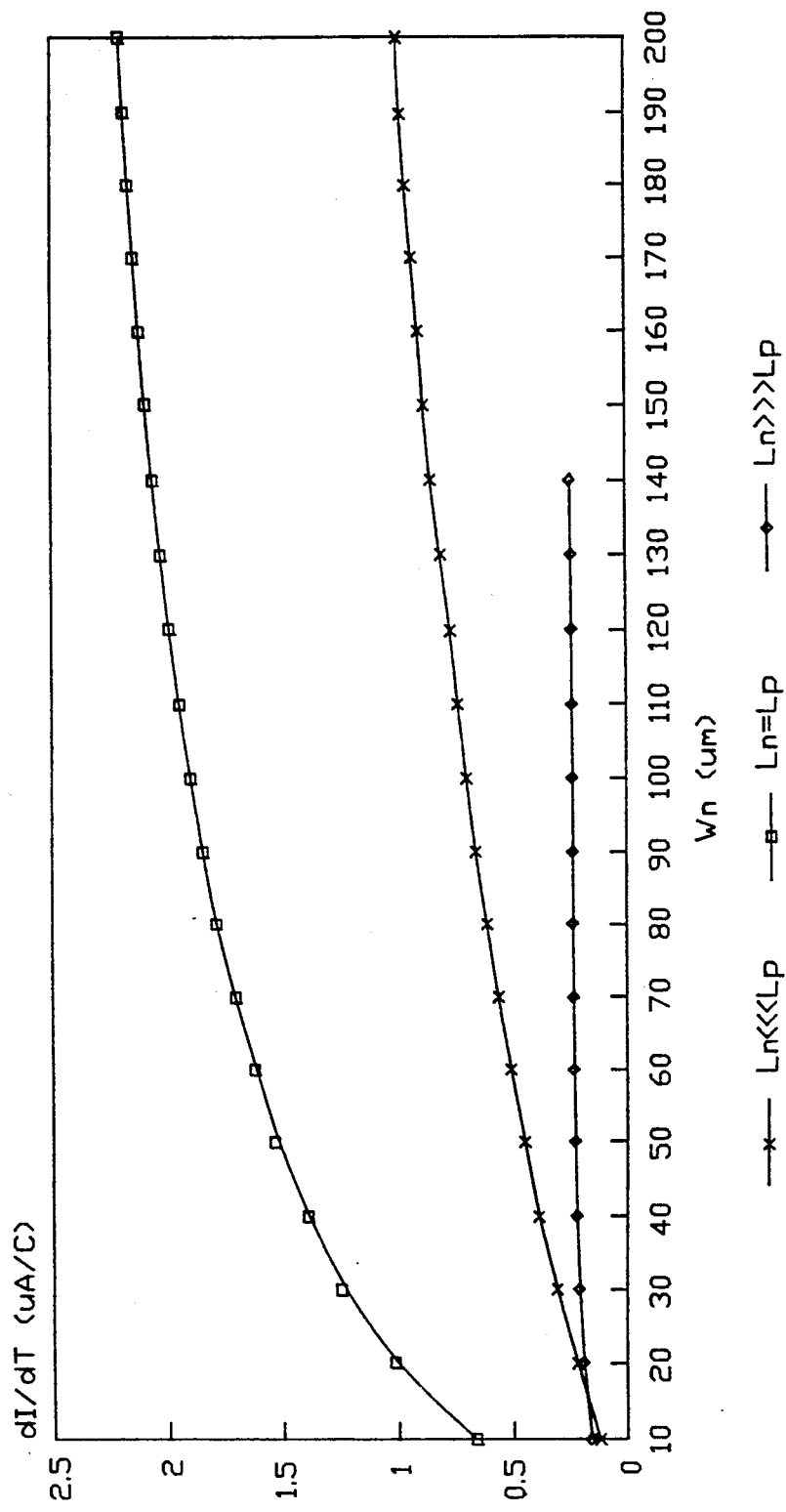
FIG. 11 is a graph of the rate of change of current with temperature with the p-channel width fixed, as the width of the n-channel device is changed for the three conditions mentioned with respect to FIG. 8.

FIGS. 10 and 11 are plotted vs. Wn while Wp is fixed. In all graphs, dI/dT is always increasing with the increase of channel width. However, looking at percent change of current over temperature (i.e. normalizing each data point to the current obtained @0 c), FIG. 10 shows the decreasing nature of percent change in current over 100 C range vs. the increase in channel width of the n-type MOSFET. While in FIG. 8, the percent change in current increases with the increase in channel width of the p-type MOSFET.

The fact that each AVD can be designed to implement fixed, increasing, or decreasing functions of temperature with respect to its I-V characteristic, is the reason behind the flexibility in controlling the output voltage.

B. Basic Operation of Controlled Voltage Source

The basic operation of the controlled voltage source might be explained as follows:

1. Assume that the upper AVD 10, which drives p-channel output MOSFET 24, is designed to operate at a current = Ia@25° c and % di over T=35%, and the second AVD 12 with a current = Ib@25° c and % dI over T=30% (with Ia=Ib).

2. The output current is controlled by $V_{R1}$ and $V_{R2}$. Assume that each of the output transistors 24, 25 is designed to mirror the current in its driver AVD, with a nominal current gain equal to 4 at 25° C., then $V_0$ will be approximately $V_{DD}/2$ at 25° C., and $I_0 = 4 \cdot Ia$.

3. Now let the temperature increase or decrease, then the output drive for one transistor is larger than the other due to the difference in current of both AVD multiplied by the current gain (i.e. net difference in current over temperature is 5% between the AVDs). Thus, the output current exhibits approximately a 20% change which in turn induces changes in the output voltage.

4. The output voltage swing is controlled by the drain to source conductance of p-channel and n-channel output transistors 24, 25, and the absolute value change of $I_0$ due to the controlling AVD.

Hence, we can see that the output voltage swing polarity is determined by both AVDs. The absolute change in output voltage is controlled by channel length and regions of operation of output transistors. Another way of changing the output voltage swing is by changing the net current difference in each AVD.

C. Regions of Operation

There are three distinct operating regions which are dictated by $V_0$, Vgs for transistor 24, and Vgs for transistor 25. Applying the conditions of operation for a MOSFET to this topology we would have only one distinct region where both output transistors 24 and 25 are in saturation. Two other regions exist where either one (i.e. 24 or 25) can be in the triode region while the other is in saturation.

Equation 3

N—CH  VGD <= VTn
P—CH  VGD >= −|VTp|

The maximum swing of $V_0$ while both 24 and 25 are saturated is governed by:

Equation 4

$$V_0 \text{(max. swing)} = V_{R1} + |VTp| + VTn - V_{R2}$$

Figure 12:
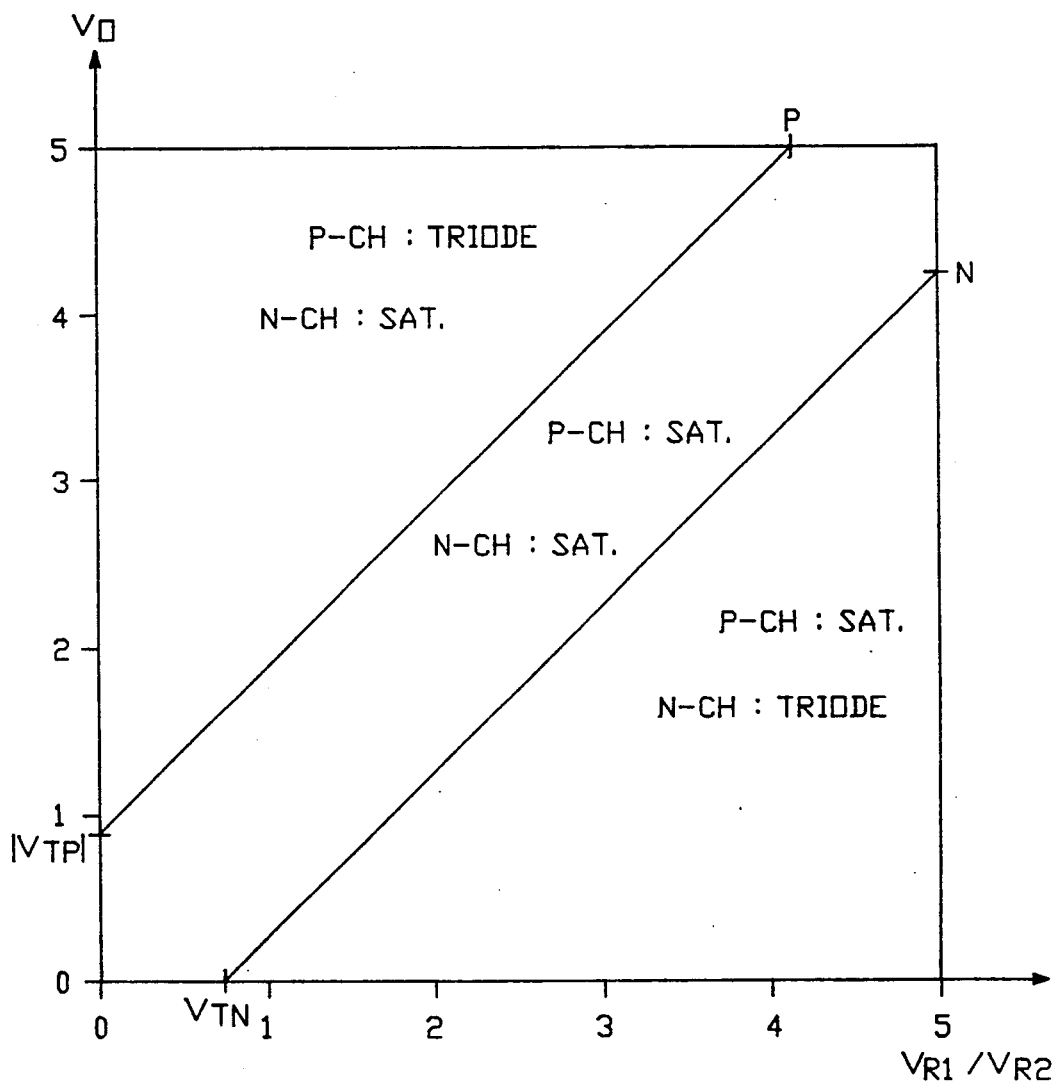
FIG. 12 is a graph illustrating the regions of operation of the output transistors for the circuit shown in FIG. 1.

FIG. 12 shows graphically these three distinct regions. FIG. 12 is a very helpful graph that indicates the needed point of operation of each AVD in order to achieve a predetermined window for the maximum allowed output voltage swing.

D. Small Signal Model

Using small signal model for the CMOS amplifier stage we can express $V_0$ in terms of transconductance and conductance of output transistors as follows in Eq. 5 which clearly shows the flexibility in obtaining either positive or negative AC gain with respect to both $V_{R1}$ and $V_{R2}$ Equation 5

$$V_0 = -\{gmn \cdot V_{R2} + (V_{R1} - V_{DD})gmp\} * 1/(gdsp + gdsn)$$

If transistor 24 is operating in triode region and transistor 25 is in saturation, then $V_0$ can be calculated using DC analysis as given in Eq. 6.

Equation 6

$$V_0 = (V_{R1} - VTp) \pm \left( (V_{R1} - VTp - V_{DD})^2 + (V_{R2} - VTn)^2 \frac{k'nWnLp}{k'pWpLn} \right)^{\frac{1}{2}}$$

Conditions: a. $V_o - V_{R1} > |VTp|$
b. $V_{R1} - V_{DD} \leq VTn$

Similarly, when transistor 24 is in saturation and transistor 25 is in triode region, $V_0$ can be found by Eq. 7. Note that these equations provide only a means for a quick start to approximately find the operating point.

Equation 7

$$V_0 = (V_{R2} - VTn) \pm \left( (V_{R2} - VTn)^2 + (V_{R1} - VTn - V_{DD})^2 \frac{k'nWnLp}{k'pWpLn} \right)^{\frac{1}{2}}$$

Conditions: a. $V_{DD} - V_{R2} < -VTn$
b. $V_{R2} \geq V_{Tn}$

E. Supply Voltage Effect on $V_0$

Supply voltage tracking can be easily achieved due to the simultaneous changes in I-V relationship from both AVDs. A lower or higher $V_{DD}$ dependency can be achieved by designing the AVDs to be less sensitive or more sensitive to $V_{DD}$ variations and/or by making the CMOS amplifier gain small or large. However, in this case the output voltage swing will become proportionally smaller or larger. In addition, adjusting just one AVD to be less or more sensitive to $V_{DD}$ will yield similar results.

Figure 4:
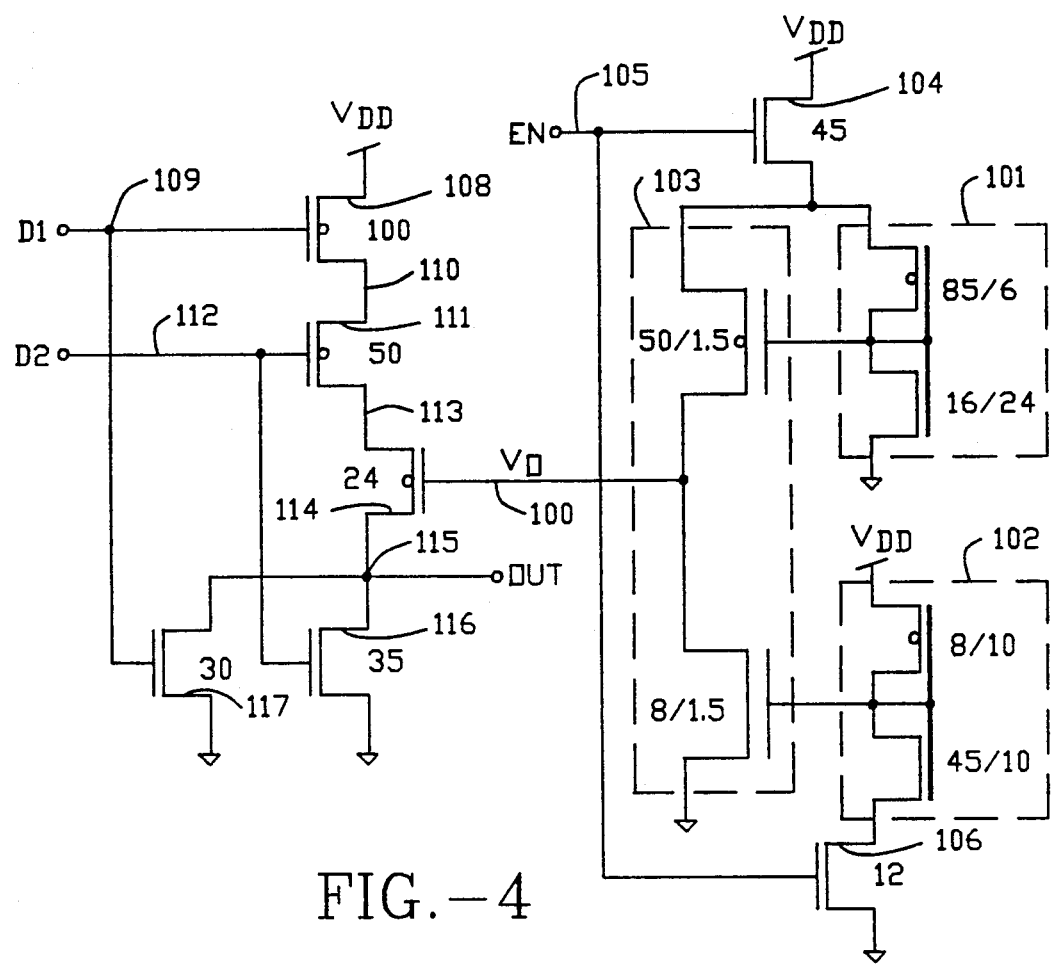
FIG. 4 is a schematic diagram of the implementation of a controlled NOR gate according to the present invention.

For example, FIG. 4 shows one controlled voltage source (as part of a NOR gate) where $V_{DD}$ dependency was designed with a gain of 2 (i.e. if $V_{DD}$ changes by 0.5V, then $V_0$ changes by almost 1.0V.) The AVD driving the PMOS output transistor was supplied along with the output stage by a current source, which is also used for power on/off, that causes AVD to be more sensitive to $V_{DD}$ variations. The second AVD is connected directly to $V_{DD}$. Hence the net driving voltage due to changes in $V_{DD}$ has been enhanced and thus the output voltage is affected to a larger degree with any changes in the power supply voltage, i.e. we have a higher gain dependency on any changes in $V_{DD}$.

F. Recommendations

Under certain conditions, the sensitivity of $V_0$ to a certain parameter may be high, therefore few suggestions may help to avoid this problem.

1. Design the current gain of the output transistors to be multiple of magnitude higher or lower. A good value is 5 or 0.2. Each circuit will dictate its own requirements to be satisfied i.e. power consumption, output voltage swing with temperature, and supply tracking.

2. Design the operating current of one AVD to be a multiple of the other, this will provide a sufficient driving capability to the CMOS amplifier stage to meet different specifications.

Figure 3:
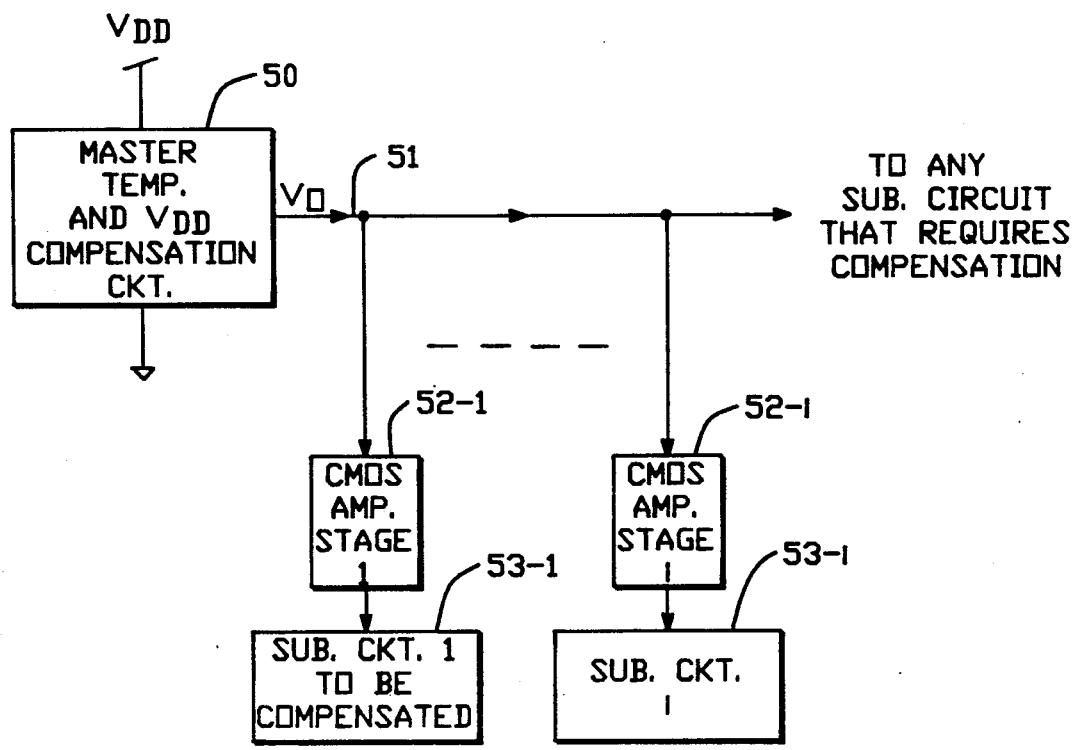
FIG. 3 is a schematic diagram of a circuit applying the controlled voltage source of the present invention to an integrated circuit with a plurality of subcircuits.

Since every output buffer requires temperature and $V_{DD}$ compensation, it may be very useful to use only one master control circuit, and as many as two transistor CMOS amplifiers as needed, as shown in FIG. 3. The master circuit can be designed to provide a large $V_0$ swing with temperature and $V_{DD}$, then each single amplifier would be designed to obtain the needed voltage window, to drive a circuit, by changing its gain. In addition, this will provide a buffer stage for the master controller from any subcircuit on the die that may need to be compensated for temperature effect.

Some of the advantages of using a single controller are:

1. Reduction of total die size, in comparison with having a control circuit for each circuit that requires temperature and $V_{DD}$ compensation in order to enhance its performance.

2. The stability (dynamic operation) of the master controller can be designed to be very high by proper layout and being buffered from subcircuits' capacitive coupling.

3. The sensitivity to process parameters and short channel length/width effects can be greatly reduced by choosing wide and long transistors.

4. The ability to compensate every circuit on the die by only using a two transistor CMOS amplifier with its gain adjusted by the appropriate sizing of either of the transistors.

5. Enhancement of total die performance, since every circuit will have the capability to be compensated for temperature and supply voltage fluctuations.

G. Design Example

Specifications

1. Output voltage swing from 4V to 0.5V when temp. varies from 0° C. to 100° C.
2. Maximum current drain 250 μA.

Design steps a. Assume $I_A = 80 \rho A$ ($I_A$ = current in AVD 10)
b. From FIG. 12 get min. values for $V_{R1}$ and $V_{R2}$ $V_{R1} \approx 3.2; V_{R2} \approx 1.2$ using data of Table I, find the size of P—CH and N—CH transistor for the AVD 10 driving the p-channel output transistor.

($V_{DD}=5.0V; T=25°c$)

$$I_n = \frac{k'W}{2L}(V_{GS} - VT_n)^2$$

$$I_p = \frac{k'W}{2L}(V_{GS} - |VT_p|)^2$$

1. $\frac{W_n}{L_n} = .4764 \rightarrow$ N—CH: $\frac{7.6}{16}$      (FET 21)

2. $\frac{W_p}{L_p} = 11.38 \rightarrow$ P—CH: $\frac{68.3}{6}$      (FET 20)

3. Verify $V_{R1}$ using Eq. (2)

$V_{R1} = 3.201$

4. Simulation results:

|         | 0°       | 25°      | 100°     |
|---------|----------|----------|----------|
| $V_{R1}$ | 3.29 v   | 3.32 v   | 3.39 v   |
| $I_A$    | 79.96 μA | 71.1 μA  | 52.72 μA | c. Similarly find the size of second AVD 12.
1. Assume $I_B \approx 2I_A = 140$ μA ($I_B$=current in AVD 12)

$\frac{W_p}{L_p} = 1.9 \rightarrow$ P—CH: $\frac{11.4}{6}$      (FET 22)

and

N—Ch: $\frac{72.5}{6}$      (FET 23)

2. Simulation shows:

|       | 0°        | 25°       | 100°     |
|-------|-----------|-----------|----------|
| $V_B$ | 1.292 v   | 1.295 v   | 1.30 v   |
| $I_B$ | 121.9 μA  | 111.4 μA  | 88.6 μA  | d. Use current gain of 0.2 for output

PMOS $$I_0 = \frac{k'_{p0} W_{p0} L_p}{k'_p W_p L_{p0}} I_A$$

we get:

$\frac{W_{p0}}{L_{p0}} = 2.2$ e. Find corresponding $V_0$ for above ratio $.2(I_a) = \frac{W_{p0} k'_{p0}}{L_{p0} 2}(V_0 - V_{DD} + V_{Tp0})^2$ solving quadratic -continued $$V_0 = \begin{cases} 5.08 \text{ v Not acceptable} \\ 3.4 \text{ v} \rightleftarrows \text{P—CH: } \frac{13.2}{5} \end{cases}$$

$V_0$ (3.4 v) is close to our design specs.
Note: If $V_0$ doesn't meet spec., a few iterations between steps d and e will solve the problem.

f. Choose minimum dimensions for output N-CH, simulate the whole circuit. Few minor adjustments to output transistor sizes should be sufficient.
Output transistors sizes came out to be P—CH: $\frac{13.6}{5}$ ; N—CH: $\frac{8.5}{5}$ $V_0$ and $I_0$ are within specs according to simulation of specific FET manufacturing technologies. Similar design techniques should apply to any manufacturing technology desired for CMOS integrated circuits.

III. Applications of Invention

Figure 5:
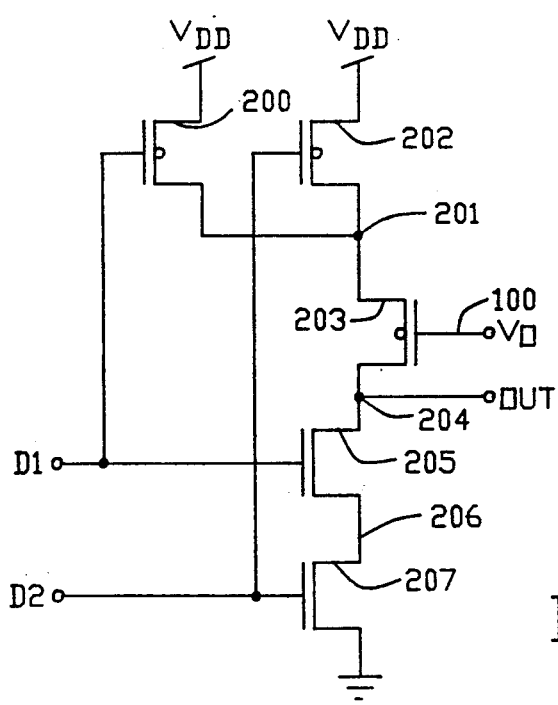
FIG. 5 is a schematic diagram of the implementation of a controlled NAND gate according to the present invention.
Figure 6:
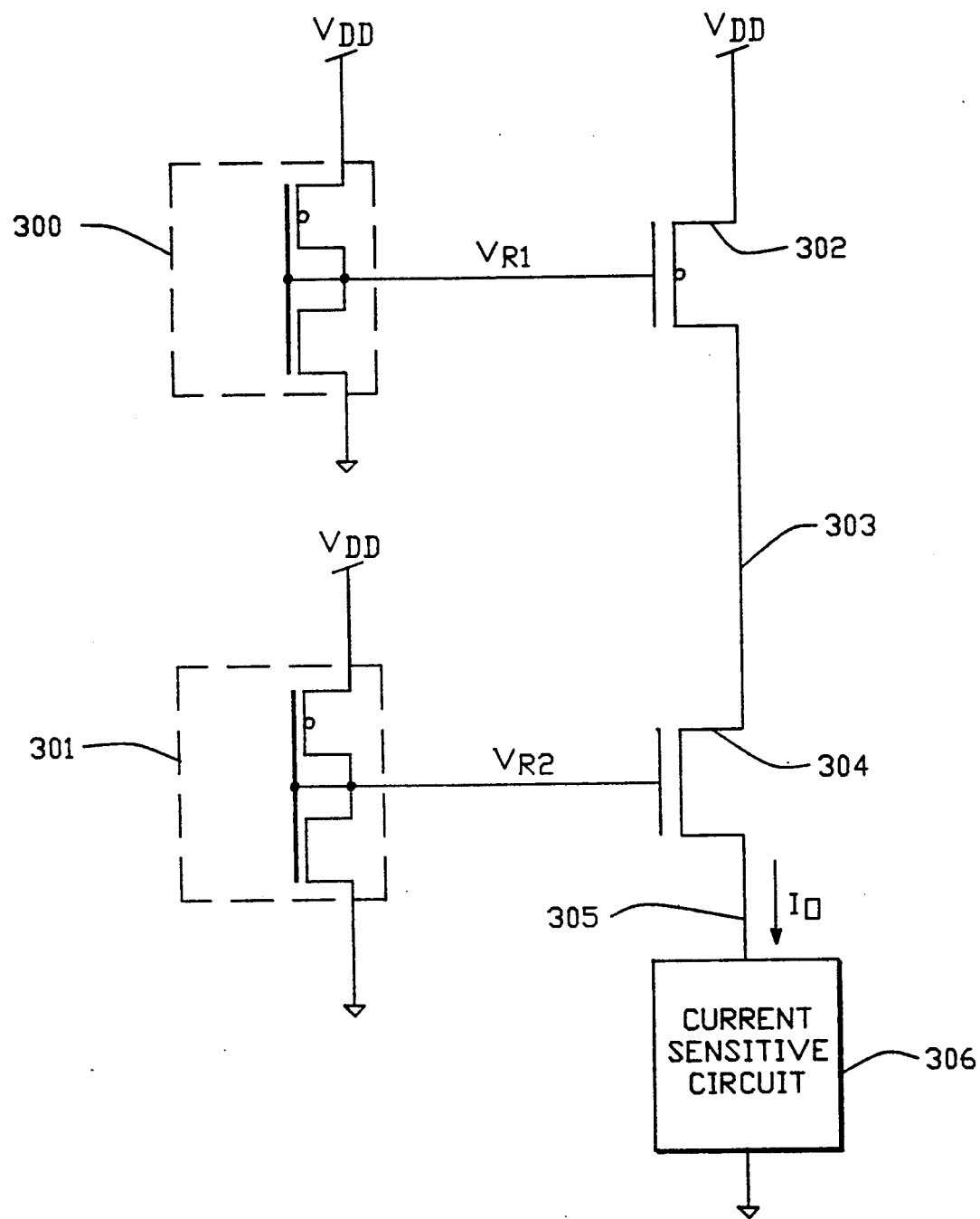
FIG. 6 is a schematic diagram of a controlled current source according to the present invention.

FIGS. 3, 4, 5, and 6 illustrate applications of the present invention. In FIG. 3, the present invention is used as a master temperature and supply voltage compensation circuit for subcircuits distributed on an integrated circuit in the generic sense. FIGS. 4 and 5 illustrate a NOR gate having a controlled output rise time independent of temperature, and a NAND gate having a controlled output rise time independent of temperature, respectively. FIG. 6 illustrates a controlled current source. Control of the output fall-time can be implemented by adding a second control transistor in series with, for instance, transistors 203 and 205 of FIG. 5.

In the circuit of FIG. 3, a master temperature and $V_{DD}$ compensation circuit 50 is connected between the supply voltage $V_{DD}$ and ground. It generates the output voltage $V_0$ corresponding to the signal at node 15 of FIG. 1 for supply along bus 51. Bus 51 is connected to a plurality of CMOS amplifier stages 52-1 through 52-i. These amplifier stages correspond to the circuit shown in FIG. 2 or can be adapted, as mentioned above, to specific needs of a given subcircuit. The outputs of the amplifier stages are supplied to respective subcircuits 53-1 through 53-i requiring the temperature and $V_{DD}$ compensated control signals.

This circuit can have a wide variety of applications in CMOS integrated circuit technology to provide a controlled voltage with relatively high fanout and very low area on the integrated circuit die.

FIGS. 4 and 5 are specific circuit diagrams of applications of the voltage control circuit of FIG. 1 according to the present invention. These include circuits for enabling or disabling controlled voltage source in response to the enable signal EN.

The circuit of FIG. 4 generates a temperature compensated voltage $V_0$ on line 100. The controlled voltage source includes the first active voltage divider 101 and second active voltage divider 102. Likewise, the output difference amplifier 103 receives the output of the first and second active voltage dividers to generate the signal $V_0$. The sizes of the transistors involved have been calculated to generate a decreasing $V_0$ with increasing temperature. In the Figure, these sizes are labelled with the width/length of the channel set out next to the transistor. For instance, the p-channel transistor in active voltage divider 101 has a width of 85μ and a length of 6μ. Channel length of transistors in FIG. 4 is the minimum channel length for the technology 1.3μ, unless otherwise noted.

The source of the p-channel transistor in the first active voltage divider 101 and the p-channel transistor in the difference amplifier 103 are coupled to the source voltage $V_{DD}$ through n-channel transistor 104. Thus, the drain of n-channel transistor 104 is connected to $V_{DD}$, the source of n-channel transistor 104 is connected to the sources of the p-channel transistors in the active voltage divider 101 and the difference amplifier 103. The gate of the n-channel transistor 104 is connected to receive the enable signal EN from terminal 105.

Similarly, the source of the n-channel transistor in the second active voltage divider 102 is coupled to ground through n-channel transistor 106. Thus, the drain of n-channel transistor 106 is connected to the source of the n-channel transistor in the active voltage divider 102, the source of the n-channel transistor 106 is connected to ground, and the gate of the n-channel transistor 106 is connected to receive the enable signal EN at node 105. Therefore, when the circuit is turned off, no current will flow through the controlled voltage source.

The controlled NOR gate of FIG. 4 consists of p-channel transistor 108 having its source connected to $V_{DD}$, its gate connected to first input D1 at node 109 and its drain connected to line 110. Second p-channel transistor 111 has its source connected to line 110, its gate connected to receive the second input D2 on line 112, and its drain connected to line 113. A third p-channel transistor 114 has its source connected to line 113, its gate connected to line 100 to receive the signal $V_0$, and its drain connected to node 115 supplying the output signal of the NOR gate.

A first n-channel transistor 116 has its drain connected to node 115, its gate connected to line 112 receiving the input signal D2, and its source connected to ground. A second n-channel transistor 117 has its drain connected to the output terminal 115, its gate connected to line 109 to receive the first input signal D1, and its source connected to ground. In the NOR gate, as temperature increases, the slew rate of the rising transition on the output line 115 will tend to decrease. Therefore, the control transistor 114 is coupled to receive the signal $V_0$ which decreases with temperature. As $V_0$ decreases, the current through the device increases, thus increasing the slew rate of the signal on node 115, therefore stabilizing the output of the NOR gate with temperature.

FIG. 5 illustrates a controlled NAND gate according to the present invention. The NAND gate in FIG. 5 receives the controlled reference signal $V_0$ on line 100 similar to that shown in FIG. 4. The NAND gate consists of a first p-channel transistor 200 having a source connected to $V_{DD}$, a drain connected to line 201, and a gate connected to receive the first input signal D1. A second p-channel transistor 202 has a source connected to supply voltage $V_{DD}$, a drain connected to line 201, and a gate connected to receive the second input signal D2.

A third p-channel transistor 203 has its source connected to line 201, its drain connected to an output node 204, and its gate connected to line 100 to receive the controlled voltage $V_0$.

A first n-channel transistor 205 has its drain connected to the output node 204, its source connected to line 206, and its gate connected to receive the first input signal D1. The second n-channel transistor 207 has its drain connected to line 206, its source connected to ground and its gate connected to receive the second input signal D2. In operation, the NAND gate output voltage rising edge slew rate on line 204 will tend to decrease with temperature. Because $V_0$ decreases, and therefore increases the current through the apparatus, it tends to increase the output voltage slew rate on line 204 with temperature, offsetting the effects of temperature in the NAND gate.

FIG. 6 is a diagram of a temperature compensated current source according to the present invention. The current source includes a first active voltage divider 300 and a second active voltage divider 301 which generate reference voltages $V_{R1}$ and $V_{R2}$, as first and second functions of temperature as described above with reference to FIG. 1. The difference amplifier consists of p-channel transistor 302 which receives $V_{R1}$ at its gate, its source is connected to $V_{DD}$, and its drain is connected to line 303. An n-channel transistor 304 in the difference amplifier has its gate connected to receive reference voltage $V_{R2}$, its drain connected to line 303 and its source connected to line 305. Line 305 is coupled through the load 306 of the current source to ground. The load 306 can be any current sensitive circuit, such as a current amplifier. In this circuit, the current $I_0$ on line 305 varies with temperature as determined by the difference between voltages $V_{R1}$ and $V_{R2}$, as well as temperature characteristics of the difference amplifier transistors 302 and 304.

IV. Conclusion

Accordingly, a controlled voltage or current source and a temperature compensated logic gate have been disclosed which are particularly suitable for CMOS technology integrated circuits. The sizes of the circuits, in terms of the area on the die required to implement them and in terms of the number of transistors, are quite small. Also, these circuits have the flexibility of providing compensation for both changes in temperature and changes in the supply voltage on the chip. Further, the voltage source can be adapted to be disabled, preventing any current flow during a quiescent state of the chip.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. An apparatus, connected to first and second voltage sources, for generating a controlled voltage, comprising:

first means, having a first reference node, connected to the first and second voltage sources and including a first MOS transistor having a gate coupled to the first reference node, for generating a first reference voltage at the first reference node, as a first function of temperature;

second means, having a second reference node, connected to the first and second voltage sources, and including a second MOS transistor having a gate coupled to the second reference node, for generating a second reference voltage at the second reference node, as a second function of temperature;

output means, having an output node and including a first current mirror output stage connected to the first reference node and a second current mirror output stage connected to the second reference node and acting as a load for the first current mirror output stage, for generating the controlled voltage at the output node in response to a combination of the first and second reference voltages.

2. The apparatus of claim 1, wherein the first and second means each comprise an active voltage divider.

3. The apparatus of claim 1, wherein the output means comprises a difference amplifier generating the controlled voltage in response to the difference between the first reference voltage and the second reference voltage.

4. The apparatus of claim 1, wherein the first means comprises:
   a p-channel MOS transistor having a source coupled to the first voltage source, a drain connected to the first reference node, and a gate connected to the first reference node; and
   an n-channel MOS transistor having a source coupled to the second voltage source, a drain connected to the first reference node, and a gate connected to the first reference node;
   wherein the p-channel MOS transistor and the n-channel MOS transistor have first characteristic parameters including channel widths and channel lengths, and the first function of temperature is determined by the first characteristic parameters.

5. The apparatus of claim 1, wherein the second means comprises:
   a p-channel MOS transistor having a source coupled to the first voltage source, a drain connected to the second reference node, and a gate connected to the second reference node; and
   an n-channel MOS transistor having a source coupled to the second voltage source, a drain connected to the second reference node, and a gate connected to the second reference node;
   wherein the p-channel MOS transistor and the n-channel MOS transistor have second characteristic parameters including channel widths and channel lengths, and the second function of temperature is determined by the second characteristic parameters.

6. The apparatus of claim 1, wherein the output means comprises:
   a p-channel MOS transistor having a source coupled to the first voltage source, a drain connected to the output node, and a gate connected to the first reference node; and
   an n-channel MOS transistor having a source coupled to the second voltage source, a drain connected to the output node, and a gate connected to the second reference node;
   wherein the p-channel MOS transistor and the n-channel MOS transistor have characteristic parameters including channel widths and channel lengths, and generate the controlled voltage as a function of the difference between the first reference voltage and the second reference voltage with a gain determined by the characteristic parameters.

7. The apparatus of claim 1, wherein the first and second voltage sources have a source voltage difference between them, and the output means further includes:
   means for offsetting changes in the source voltage difference.

8. The apparatus of claim 7, wherein the output means includes a first stage generating a temperature compensated signal, and the means for offsetting comprises:
   a p-channel MOS transistor having a source coupled to the first voltage source, a drain connected to the output node, and a gate connected to the output node; and
   an n-channel MOS transistor having a source coupled to the second voltage source, a drain connected to the output node, and a gate connected to receive the temperature compensated signal.

9. An apparatus, connected to first and second voltage sources, and receiving an enable signal, for generating a controlled voltage, comprising:
   first current switch means, having a first supply node, connected to the first voltage source and receiving the enable signal, for supplying current from the first voltage source to the first supply node in response to the enable signal;
   second current switch means, having a second supply node, connected to the second voltage source and receiving the enable signal, for supplying current from the second voltage source to the second supply node in response to the enable signal;
   first means, having a first reference node and connected to the first supply node and the second voltage source, for generating first reference voltage at the first reference node, as a first function of temperature;
   second means, having a second reference node and connected to the first voltage source and the second supply node, for generating a second reference voltage at the second reference node, as a second function of temperature;
   output means, connected to the first reference node and the second reference node and having an output node, for generating the controlled voltage at the output node in response to a combination of the first and second reference voltages.

10. The apparatus of claim 9, wherein the first and second means each comprise an active voltage divider.

11. The apparatus of claim 9, wherein the output means comprises a difference amplifier generating the controlled voltage in response to the difference between the first reference voltage and the second reference voltage.

12. The apparatus of claim 9, wherein the first means comprises:
   a p-channel MOS transistor having a source connected to the first supply node, a drain connected to the first reference node, and a gate connected to the first reference node; and
   an n-channel MOS transistor having a source coupled to the second voltage source, a drain connected to the first reference node, and a gate connected to the first reference node;
   wherein the p-channel MOS transistor and the n-channel MOS transistor have first characteristic parameters including channel widths and channel lengths, and the first function of temperature is determined by the first characteristic parameters.

13. The apparatus of claim 9, wherein the second means comprises:
   a p-channel MOS transistor having a source coupled to the first voltage source, a drain connected to the second reference node, and a gate connected to the second reference node; and
   an n-channel MOS transistor having a source connected to the second supply node, a drain connected to the second reference node, and a gate connected to the second reference node;
   wherein the p-channel MOS transistor and the n-channel MOS transistor have second characteristic parameters including channel widths and channel lengths, and the second function of temperature is determined by the second characteristic parameters.

14. The apparatus of claim 9, wherein the output means comprises:
   a p-channel MOS transistor having a source connected to the first supply node, a drain connected to the output node, and a gate connected to the first reference node; and
   an n-channel MOS transistor having a source coupled to the second voltage source, a drain connected to the output node, and a gate connected to the second reference node;
   wherein the p-channel MOS transistor and the n-channel MOS transistor have characteristic parameters including channel widths and channel lengths, and generate the controlled voltage as a function of the difference between the first reference voltage and the second reference voltage with a gain determined by the characteristic parameters.

15. The apparatus of claim 9, wherein the first current switch means comprises:
   an n-channel MOS transistor, having a source connected to the first supply voltage, a drain connected to the first supply node and a gate connected to receive the enable signal.

16. The apparatus of claim 9, wherein the second current switch means comprises:
   an n-channel MOS transistor, having a drain connected to the second supply voltage, a source connected to the second supply node and a gate connected to receive the enable signal.

17. The apparatus of claim 9, wherein the first and second voltage sources have a source voltage difference between them, and the output means further includes:
   means for offsetting changes in the source voltage difference.

18. The apparatus of claim 17, wherein the output means includes a first stage generating a temperature compensated signal, and the means for offsetting comprises:
   p-channel MOS transistor having a source connected to the first voltage source, a drain connected to the output node, and a gate connected to the output node; and
   an n-channel MOS transistor having a source connected to the second voltage source, a drain connected to the output node, and a gate connected to receive the temperature compensated signal.

19. An apparatus, connected to first and second voltage sources having a source voltage difference between them, for generating a controlled voltage, comprising:
   first means, having a first reference node and coupled between the first and second voltage sources, for generating a first reference voltage at the first reference node, as a first function of temperature;
   second means, having a first reference node and coupled between the first and second voltage sources, for generating a second reference voltage at the second reference node, as a second function of temperature;
   combining means, connected to the first reference node and the second reference node and having an output node, for generating a temperature compensated voltage at the output node in response to a combination of the first and second reference voltage; and
   output means, having a controlled node and connected to the output node of the combining means, for supplying the controlled voltage at the controlled node in response to the temperature compensated voltage, including means for offsetting changes in the source voltage difference.

20. The apparatus of claim 19, wherein the first and second means each comprise an active voltage divider.

21. The apparatus of claim 19, wherein the combining means comprises a difference amplifier generating the temperature compensated voltage in response to the difference between the first reference voltage and the second reference voltage.

22. The apparatus of claim 19, wherein the first means comprises:
   a p-channel MOS transistor having a source coupled to the first voltage source, a drain connected to the first reference node, and a gate connected to the first reference node; and
   an n-channel MOS transistor having a source coupled to the second voltage source, a drain connected to the first reference node, and a gate connected to the first reference node;
   wherein the p-channel MOS transistor and the n-channel MOS transistor have first characteristic parameters including channel widths and channel lengths, and the first function of temperature is determined by the first characteristic parameters.

23. The apparatus of claim 19, wherein the second means comprises:
   a p-channel MOS transistor having a source coupled to the first voltage source, a drain connected to the second reference node, and a gate connected to the second reference node; and
   an n-channel MOS transistor having a source coupled to the second voltage source, a drain connected to the second reference node, and a gate connected to the second reference node;
   wherein the p-channel MOS transistor and the n-channel MOS transistor have second characteristic parameters including channel widths and channel lengths, and the second function of temperature is determined by the second characteristic parameters.

24. The apparatus of claim 19, wherein the combining means comprises:
   a p-channel MOS transistor having a source coupled to the first voltage source, a drain connected to the output node, and a gate connected to the first reference node; and
   an n-channel MOS transistor having a source coupled to the second voltage source, a drain connected to the output node, and a gate connected to the second reference node;

wherein the p-channel MOS transistor and the n-channel MOS transistor have characteristic parameters including channel widths and channel lengths, and generate the temperature compensated voltage as a function of the difference between the first reference voltage and the second reference voltage with a gain determined by the characteristic parameters.

25. The apparatus of claim 19, wherein the means for offsetting comprises:

a p-channel MOS transistor having a source coupled to the first voltage source, a drain connected to the controlled node, and a gate connected to the controlled node; and an n-channel MOS transistor having a source coupled to the second voltage source, a drain connected to the controlled node, and a gate connected to receive the temperature compensated signal.

26. The apparatus of claim 25, wherein means for offsetting has a gain offsetting changes in the temperature compensated voltage due to changes in the source voltage difference, and the p-channel MOS transistor and the n-channel MOS transistor have characteristic parameters including channel widths and channel lengths, and the gain is determined by the characteristic parameters.

27. The apparatus of claim 19, further including means for enabling and disabling current flow from the first and second voltage sources to the apparatus.

28. An apparatus, connected to first and second voltage sources, for generating a controlled output voltage, comprising:

a first p-channel MOS transistor having a source coupled to the first voltage source, a drain connected to a reference node, and a gate connected to the reference node; and a first n-channel MOS transistor having a source coupled to the second voltage source, a drain connected to the reference node, and a gate connected to the reference node;

wherein the first p-channel MOS transistor and the first n-channel MOS transistor have first characteristic parameters including channel widths and channel lengths, and generate a voltage at the first reference node as a first function of temperature determined by the first characteristic parameters;

a second p-channel MOS transistor having a source coupled to the first voltage source, a drain connected to a second reference node, and a gate connected to the second reference node; and a second n-channel MOS transistor having a source coupled to the second voltage source, a drain connected to the second reference node, and a gate connected to the second reference node;

wherein the second p-channel MOS transistor and the second n-channel MOS transistor have second characteristic parameters including channel widths and channel lengths, and generate a second reference voltage at the second reference node as a second function of temperature determined by the second characteristic parameters;

a third p-channel MOS transistor having a source coupled to the first voltage source, a drain connected to an output node, and a gate connected to the first reference node; and a third n-channel MOS transistor having a source coupled to the second voltage source, a drain connected to the output node, and a gate connected to the second reference mode;

wherein the third p-channel MOS transistor and the third n-channel MOS transistor have third characteristic parameters including channel widths and channel lengths, and generate a voltage as a function of the difference between the first reference voltage and the second reference voltage and a gain determined by the third characteristic parameters.

29. The apparatus of claim 28, further including:

a fourth p-channel MOS transistor having a source coupled to the first voltage source, a drain connected to a controlled node, and a gate connected to the controlled node; and a fourth n-channel MOS transistor having a source coupled to the second voltage source, a drain connected to the controlled node, and a gate connected to the output node;

wherein the fourth p-channel MOS transistor and the fourth n-channel MOS transistor have fourth characteristic parameters including channel widths and channel lengths, and a gain determined by the fourth characteristic parameters to offset changes in voltage at the output node and to generate an output voltage at the controlled node.

30. The apparatus of claim 28, further including means for enabling and disabling current flow from the first and second voltage sources to the apparatus.

31. An apparatus, connected to first and second voltage sources, for generating a controlled current, comprising;

first means, having a first reference node and coupled between the first and second voltage sources, for generating a first reference voltage at the first reference node, as a first function of temperature;

second means, having a first reference node and coupled between the first and second voltage sources, for generating a second reference voltage at the second reference node, as a second function of temperature;

output means, connected to the first reference node and the second reference node and having an output node, for generating the controlled current at the output node in response to a combination of the first and second reference voltages.

32. The apparatus of claim 31, wherein the first and second means each comprise an active voltage divider.

33. The apparatus of claim 31, wherein the output means comprises a difference amplifier generating the controlled current in response to the difference between the first reference voltage and the second reference voltage.

34. The apparatus of claim 31, wherein the first means comprises:

a p-channel MOS transistor having a source coupled to the first voltage source, a drain connected to the first reference node, and a gate connected to the first reference node; and an n-channel MOS transistor having a source coupled to the second voltage source, a drain connected to the first reference node, and a gate connected to the first reference node;

wherein the p-channel MOS transistor and the n-channel MOS transistor have first characteristic parameters including channel widths and channel lengths, and the first function of temperature is determined by the first characteristic parameters.

35. The apparatus of claim 31, wherein the second means comprises:
- a p-channel MOS transistor having a source coupled to the first voltage source, a drain connected to the second reference node, and a gate connected to the second reference node; and
- an n-channel MOS transistor having a source coupled to the second voltage source, a drain connected to the second reference node, and a gate connected to the second reference node;
- wherein the p-channel MOS transistor and the n-channel MOS transistor have second characteristic parameters including channel widths and channel lengths, and the second function of temperature is determined by the second characteristic parameters.

36. The apparatus of claim 31, wherein the output means comprises:
- a p-channel MOS transistor having a source coupled to the first voltage source, a drain, and a gate connected to the first reference node; and
- an n-channel MOS transistor having a source coupled to the output node, a drain connected to the drain of the p-channel MOS transistor, and a gate connected to the second reference node;
- wherein the p-channel MOS transistor and the n-channel MOS transistor have characteristic parameters including channel widths and channel lengths, and generate the controlled current as a function of the difference between the first reference voltage and the second reference voltage with a gain determined by the characteristic parameters.

37. A logic gate having a plurality of inputs and a temperature compensated output and connected to a first voltage source and a second voltage source, comprising:
- means for generating a controlled voltage as a function of temperature;
- a plurality of p-channel MOS transistors connected in series between a first supply voltage and a first node, each p-channel transistor in the plurality having a gate connected to a respective one of the plurality of inputs;
- a control p-channel transistor, having a source connected to the first node, a drain connected to a second node, and a gate connected to receive the controlled voltage; and
- a plurality of n-channel transistors connected in parallel between the second node and a second supply voltage, each n-channel transistor in the plurality having a gate connected to a respective one of the plurality of inputs.

38. The logic gate of claim 37, wherein the means for generating a controlled voltage comprises:
- first means, having a first reference node and coupled to the first and second voltage sources, for generating a first reference voltage at the first reference node, as a first function of temperature;
- second means, having a first reference node and coupled to the first and second voltage sources, for generating a second reference voltage at the second reference node, as a second function of temperature;
- output means, connected to the first reference node and the second reference node and having an output node, for generating the controlled voltage at the output node in response to a combination of the first and second reference voltages.

39. The logic gate of claim 38, wherein the first and second means each comprise an active voltage divider.

40. The logic gate of claim 38, wherein the output means comprises a difference amplifier generating the controlled voltage in response to the difference between the first reference voltage and the second reference voltage.

41. The logic gate of claim 38, wherein the first means comprises:
- a first p-channel MOS transistor having a source coupled to the first voltage source, a drain connected to the first reference node, and a gate connected to the first reference node; and
- a first n-channel MOS transistor having a source coupled to the second voltage source, a drain connected to the first reference node, and a gate connected to the first reference node;
- wherein the first p-channel MOS transistor and the first n-channel MOS transistor have first characteristic parameters including channel widths and channel lengths, and the first function of temperature is determined by the first characteristic parameters; and
- wherein the second means comprises;
- a second p-channel MOS transistor having a source coupled to the first voltage source, a drain connected to the second reference node, and a gate connected to the second reference node; and
- a second n-channel MOS transistor having a source coupled to the second voltage source, a drain connected to the second reference node, and a gate connected to the second reference node;
- wherein the second p-channel MOS transistor and the second n-channel MOS transistor have second characteristics parameters including channel widths and channel lengths, and the second function of temperature is determined by the second characteristic parameters.

42. The logic gate of claim 38, wherein the output means comprises:
- p-channel MOS transistor having a source coupled to the first voltage source, a drain connected to the output node, and a gate connected to the first reference node; and
- an n-channel MOS transistor having a source coupled to the second voltage source, a drain connected to the output node, and a gate connected to the second reference node;
- wherein the p-channel MOS transistor and the n-channel MOS transistor have characteristic parameters including channel widths and channel lengths, and generate the controlled voltage as a function of the difference between the first reference voltage and the second reference voltage with a gain determined by the characteristic parameters.

43. The logic gate of claim 37, wherein the means for generating a controlled voltage further receives an enable signal, and comprises:
- first current switch means, having a first supply node and connected to the first voltage source and receiving the enable signal, for supplying current from the first voltage source to the first supply node in response to the enable signal;
- second current switch means, having a second supply node and connected to the second voltage source and receiving the enable signal, for supplying current from the second voltage source to the second supply node in response to the enable signal;

first means, having a first reference node and connected to the first supply node and the second voltage source, for generating a first reference voltage at the first reference node, as a first function of temperature;

second means, having a second reference node and connected to the first voltage source and the second supply node, for generating a second reference voltage at the second reference node, as a second function of temperature;

output means, connected to the first reference node and the second reference node and having an output node, for generating the controlled voltage at the output node in response to a combination of the first and second reference voltages.

44. A logic gate having a plurality of inputs and a temperature compensated output and connected to a first voltage source and a second voltage source, comprising:

means for generating a controlled voltage as a function of temperature;

a plurality of p-channel MOS transistors connected in parallel between a first supply voltage and a first node, each p-channel transistor in the plurality having a gate connected to a respective one of the plurality of inputs;

a control p-channel transistor, having a source connected to the first node, a drain connected to a second node, and a gate connected to receive the controlled voltage; and a plurality of n-channel transistors connected in series between the second node and a second supply voltage, each n-channel transistor in the plurality having a gate connected to a respective one of the plurality of inputs.

45. The logic gate of claim 44, wherein the means for generating a controlled voltage comprises:

first means, having a first reference node and coupled to the first and second voltage sources, for generating a first reference voltage at the first reference node, as a first function of temperature;

second means, having a first reference node and coupled to the first and second voltage sources, for generating a second reference voltage at the second reference node, as a second function of temperature;

output means, connected to the first reference node and the second reference node and having an output node, for generating the controlled voltage at the output node in response to a combination of the first and second reference voltages.

46. The logic gate of claim 45, wherein the first and second means each comprise an active voltage divider.

47. The logic gate of claim 45, wherein the output means comprises a difference amplifier generating the controlled voltage in response to the difference between the first reference voltage and the second reference voltage.

48. The logic gate of claim 45, wherein the first means comprises:

a first p-channel MOS transistor having a source coupled to the first voltage source, a drain connected to the first reference node, and a gate connected to the first reference node; and a first n-channel MOS transistor having a source coupled to the second voltage source, a drain connected to the first reference node, and a gate connected to the first reference node;

wherein the first p-channel MOS transistor and the first n-channel MOS transistor have first characteristic parameters including channel widths and channel lengths, and the first function of temperature is determined by the first characteristic parameters; and wherein the second means comprises:

a second p-channel MOS transistor having a source coupled to the first voltage source, a drain connected to the second reference node, and a gate connected to the second reference node; and a second n-channel MOS transistor having a source coupled to the second voltage source, a drain connected to the second reference node, and a gate connected to the second reference node;

wherein the second p-channel MOS transistor and the second n-channel MOS transistor have second characteristic parameters including channel widths and channel lengths, and the second function of temperature is determined by the second characteristic parameters.

49. The logic gate of claim 45, wherein the output means comprises:

a p-channel MOS transistor having a source coupled to the first voltage source, a drain connected to the output node, and a gate connected to the first reference node; and an n-channel MOS transistor having a source coupled to the second voltage source, a drain connected to the output node, and a gate connected to the second reference node;

wherein the p-channel MOS transistor and the n-channel MOS transistor have characteristic parameters including channel widths and channel lengths, and generate the controlled voltage as a function of the difference between the first reference voltage and the second reference voltage with a gain determined by the characteristic parameters.

50. The logic gate of claim 44, wherein the means for generating a controlled voltage further receives an enable signal, and comprises:

first current switch means, having a first supply node and connected to the first voltage source and receiving the enable signal, for supplying current from the first voltage source to the first supply node in response to the enable signal;

second current switch means, having a second supply node and connected to the second voltage source and receiving the enable signal, for supplying current from the second voltage source to the second supply node in response to the enable signal;

first means, having a first reference node and connected to the first supply node and the second voltage source, for generating a first reference voltage at the first reference node, as a first function of temperature;

second means, having a second reference node and connected to the first voltage source and the second supply node, for generating a second reference voltage at the second reference node, as a second function of temperature;

output means, connected to the first reference node and the second reference node and having an output node, for generating the controlled voltage at the output node in response to a combination of the first and second reference voltages.

* * * * *